(12) United States Patent
Caron et al.

(10) Patent No.: US 10,699,878 B2
(45) Date of Patent: Jun. 30, 2020

(54) CHAMBER MEMBER OF A PLASMA SOURCE AND PEDESTAL WITH RADIALLY OUTWARD POSITIONED LIFT PINS FOR TRANSLATION OF A SUBSTRATE C-RING

(71) Applicant: Lam Research Corporation, Fremont, CA (US)

(72) Inventors: James Eugene Caron, Tracy, CA (US);
Ivelin Angelov, San Jose, CA (US);
Jason Lee Treadwell, Gilroy, CA (US);
Joon Hong Park, Dublin, CA (US);
Canfeng Lai, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 426 days.

(21) Appl. No.: 15/428,585

(22) Filed: Feb. 9, 2017

(65) Prior Publication Data
US 2017/0236688 A1    Aug. 17, 2017

Related U.S. Application Data

(60) Provisional application No. 62/294,574, filed on Feb. 12, 2016.

(51) Int. Cl.
*H01J 37/32* (2006.01)

(52) U.S. Cl.
CPC ...... *H01J 37/32082* (2013.01); *H01J 37/321* (2013.01); *H01J 37/3244* (2013.01);
(Continued)

(58) Field of Classification Search
CPC ............. H01J 37/32082; H01J 37/3244; H01J 37/32651; H01J 37/32715;
(Continued)

(56) References Cited

U.S. PATENT DOCUMENTS

| 4,262,686 A | 4/1981 | Heim et al. |
| 4,374,698 A | 2/1983 | Sanders et al. |

(Continued)

FOREIGN PATENT DOCUMENTS

| CN | 1701421 A | 11/2005 |
| CN | 102243077 A | 11/2011 |

(Continued)

OTHER PUBLICATIONS

Bohr, Mark, "The New Era of Scaling in an SoC World" Intel Logic Technology Development; ISSCC; 2009; 66 Pages.

(Continued)

*Primary Examiner* — Yuechuan Yu

(57) ABSTRACT

A chamber member of a plasma source is provided and includes a sidewall, a transition member, a top wall and an injector connecting member. The sidewall is cylindrically-shaped and surrounds an upper region of a substrate processing chamber. The transition member is connected to the sidewall. The top wall is connected to the transition member. The injector connecting member is connected to the top wall, positioned vertically higher than the sidewall, and configured to connect to a gas injector. Gas passes through the injector connecting member via the gas injector and into the upper region of the substrate processing chamber. A center height to low inner diameter ratio of the chamber member is 0.25-0.5 and/or a center height to outer height ratio of the chamber member is 0.4-0.85.

27 Claims, 14 Drawing Sheets

(52) U.S. Cl.
CPC .. *H01J 37/32458* (2013.01); *H01J 37/32532* (2013.01); *H01J 37/32651* (2013.01); *H01J 37/32715* (2013.01); *H01J 37/32724* (2013.01); *H01J 2237/334* (2013.01)

(58) Field of Classification Search
CPC ............... H01J 37/32532; H01J 37/321; H01J 37/32458; H01J 37/32724; H01J 2237/334
See application file for complete search history.

(56) References Cited

U.S. PATENT DOCUMENTS

| | | | |
|---|---|---|---|
| 4,431,477 | A | 2/1984 | Zajac |
| 4,793,897 | A | 12/1988 | Dunfield et al. |
| 5,329,965 | A | 7/1994 | Gordon |
| 5,346,578 | A * | 9/1994 | Benzing ............... H05H 1/46 156/345.48 |
| 5,605,179 | A | 2/1997 | Strong, Jr. et al. |
| 5,660,673 | A | 8/1997 | Miyoshi |
| 5,662,143 | A | 9/1997 | Caughran |
| 5,744,695 | A | 4/1998 | Forbes |
| 5,762,714 | A | 6/1998 | Mohn et al. |
| 5,907,221 | A * | 5/1999 | Sato ...................... H01J 37/321 118/723 MP |
| 6,022,609 | A | 2/2000 | Fan |
| 6,042,687 | A | 3/2000 | Singh et al. |
| 6,044,534 | A | 4/2000 | Seo et al. |
| 6,050,283 | A | 4/2000 | Hoffman et al. |
| 6,060,400 | A | 5/2000 | Oehrlein et al. |
| 6,074,959 | A | 6/2000 | Wang et al. |
| 6,152,168 | A | 11/2000 | Ohmi et al. |
| 6,206,976 | B1 | 3/2001 | Crevasse et al. |
| 6,210,593 | B1 | 4/2001 | Ohkuni et al. |
| 6,217,937 | B1 | 4/2001 | Shealy |
| 6,376,386 | B1 | 4/2002 | Oshima |
| 6,492,774 | B1 | 12/2002 | Han et al. |
| 6,589,352 | B1 | 7/2003 | Yudovsky et al. |
| 6,736,931 | B2 * | 5/2004 | Collins ............... B01D 53/22 156/345.48 |
| 6,744,212 | B2 | 6/2004 | Fischer et al. |
| 6,818,560 | B1 | 11/2004 | Koshimizu et al. |
| 6,841,943 | B2 | 1/2005 | Vahedi et al. |
| 6,896,765 | B2 | 5/2005 | Steger |
| 6,898,558 | B2 | 5/2005 | Klekotka |
| 6,962,879 | B2 | 11/2005 | Zhu et al. |
| 7,129,171 | B2 | 10/2006 | Zhu et al. |
| 7,288,482 | B2 | 10/2007 | Panda et al. |
| 7,309,646 | B1 | 12/2007 | Heo et al. |
| 7,338,907 | B2 | 3/2008 | Li et al. |
| 7,757,541 | B1 | 7/2010 | Monkowski et al. |
| 7,758,698 | B2 | 7/2010 | Bang et al. |
| 7,968,469 | B2 | 6/2011 | Collins et al. |
| 8,137,463 | B2 | 3/2012 | Liu et al. |
| 8,552,334 | B2 | 10/2013 | Tappan et al. |
| 8,555,920 | B2 | 10/2013 | Hirata et al. |
| 8,592,328 | B2 | 11/2013 | Hausmann et al. |
| 8,889,024 | B2 | 11/2014 | Watanabe et al. |
| 8,956,980 | B1 | 2/2015 | Chen et al. |
| 8,999,106 | B2 | 4/2015 | Liu et al. |
| 9,011,637 | B2 | 4/2015 | Yamamoto |
| 9,051,647 | B2 | 6/2015 | Cooperberg et al. |
| 9,059,678 | B2 | 6/2015 | Long et al. |
| 9,142,391 | B2 | 9/2015 | Yamamoto |
| 9,318,343 | B2 | 4/2016 | Ranjan et al. |
| 9,471,065 | B2 | 10/2016 | Koyomogi et al. |
| 9,640,409 | B1 | 5/2017 | Yang et al. |
| 2001/0002581 | A1 | 6/2001 | Nishikawa et al. |
| 2001/0004903 | A1 | 6/2001 | Ohmi et al. |
| 2001/0013363 | A1 | 8/2001 | Kitayama et al. |
| 2001/0035530 | A1 | 11/2001 | Udagawa |
| 2002/0038669 | A1 | 4/2002 | Yamagishi et al. |
| 2002/0042205 | A1 | 4/2002 | McMillin et al. |
| 2002/0045265 | A1 | 4/2002 | Bergh et al. |
| 2002/0046991 | A1 | 4/2002 | Smith et al. |
| 2002/0048536 | A1 | 4/2002 | Bergh et al. |
| 2002/0072240 | A1 | 6/2002 | Koike |
| 2002/0088542 | A1 | 7/2002 | Nishikawa et al. |
| 2002/0160125 | A1 | 10/2002 | Johnson et al. |
| 2002/0174905 | A1 | 11/2002 | Latino et al. |
| 2002/0175144 | A1 | 11/2002 | Hung et al. |
| 2003/0201069 | A1 | 10/2003 | Johnson |
| 2003/0236592 | A1 | 12/2003 | Shajii et al. |
| 2003/0236638 | A1 | 12/2003 | Shajii et al. |
| 2003/0236643 | A1 | 12/2003 | Shajii et al. |
| 2004/0053428 | A1 | 3/2004 | Steger |
| 2004/0089240 | A1 | 5/2004 | Dando et al. |
| 2004/0094206 | A1 | 5/2004 | Ishida |
| 2004/0112538 | A1 | 6/2004 | Larson et al. |
| 2004/0112539 | A1 | 6/2004 | Larson et al. |
| 2004/0112540 | A1 | 6/2004 | Larson et al. |
| 2004/0149389 | A1 | 8/2004 | Fink |
| 2004/0163601 | A1 | 8/2004 | Kadotani et al. |
| 2004/0168719 | A1 | 9/2004 | Nambu |
| 2004/0173270 | A1 | 9/2004 | Harris et al. |
| 2004/0200529 | A1 | 10/2004 | Lull et al. |
| 2005/0005994 | A1 | 1/2005 | Sugiyama et al. |
| 2005/0067021 | A1 | 3/2005 | Bevers et al. |
| 2005/0082007 | A1 | 4/2005 | Nguyen et al. |
| 2005/0155625 | A1 | 7/2005 | Jangjian et al. |
| 2005/0199342 | A1 | 9/2005 | Shajii et al. |
| 2005/0241763 | A1 | 11/2005 | Huang et al. |
| 2006/0011237 | A1 | 1/2006 | Tison et al. |
| 2006/0060141 | A1 * | 3/2006 | Kamaishi ............ H01J 37/3244 118/715 |
| 2006/0097644 | A1 | 5/2006 | Kono et al. |
| 2006/0124169 | A1 | 6/2006 | Mizusawa et al. |
| 2006/0207595 | A1 | 9/2006 | Ohmi et al. |
| 2006/0237063 | A1 | 10/2006 | Ding et al. |
| 2007/0026684 | A1 | 2/2007 | Parascandola et al. |
| 2007/0066038 | A1 | 3/2007 | Sadjadi et al. |
| 2007/0158025 | A1 | 7/2007 | Larson |
| 2007/0175391 | A1 | 8/2007 | Mizusawa |
| 2007/0204797 | A1 | 9/2007 | Fischer |
| 2007/0204914 | A1 | 9/2007 | Kurosawa et al. |
| 2007/0233412 | A1 | 10/2007 | Gotoh et al. |
| 2007/0240778 | A1 | 10/2007 | L'Bassi et al. |
| 2007/0256785 | A1 | 11/2007 | Pamarthy et al. |
| 2007/0256786 | A1 | 11/2007 | Zhou et al. |
| 2007/0259112 | A1 | 11/2007 | Ishikawa et al. |
| 2008/0115834 | A1 | 5/2008 | Geoffrion et al. |
| 2008/0121178 | A1 | 5/2008 | Bang et al. |
| 2008/0202588 | A1 | 8/2008 | Gold et al. |
| 2008/0202609 | A1 | 8/2008 | Gold et al. |
| 2008/0202610 | A1 | 8/2008 | Gold et al. |
| 2008/0223873 | A1 | 9/2008 | Chen et al. |
| 2008/0236749 | A1 | 10/2008 | Koshimizu et al. |
| 2009/0056629 | A1 | 3/2009 | Katz et al. |
| 2009/0061083 | A1 | 3/2009 | Chiang et al. |
| 2009/0061640 | A1 | 3/2009 | Wong et al. |
| 2009/0061644 | A1 | 3/2009 | Chiang et al. |
| 2009/0067954 | A1 | 3/2009 | Lanee et al. |
| 2009/0090174 | A1 | 4/2009 | Paul et al. |
| 2009/0095364 | A1 | 4/2009 | Itoh et al. |
| 2009/0183548 | A1 | 7/2009 | Monkowski et al. |
| 2009/0183549 | A1 | 7/2009 | Monkowski et al. |
| 2009/0197423 | A1 | 8/2009 | Koshimizu et al. |
| 2009/0221117 | A1 | 9/2009 | Tan et al. |
| 2009/0236313 | A1 * | 9/2009 | Qiu ...................... H01J 37/3244 216/67 |
| 2009/0272717 | A1 | 11/2009 | Pamarthy |
| 2009/0320754 | A1 | 12/2009 | Oya et al. |
| 2010/0012310 | A1 | 1/2010 | Christensen et al. |
| 2010/0025369 | A1 | 2/2010 | Negishi et al. |
| 2010/0030390 | A1 | 2/2010 | Yamaguchi et al. |
| 2010/0071438 | A1 | 3/2010 | Davis et al. |
| 2010/0144539 | A1 | 6/2010 | Bergh et al. |
| 2010/0145633 | A1 | 6/2010 | Yasuda |
| 2010/0178770 | A1 | 7/2010 | Zin |
| 2010/0229976 | A1 | 9/2010 | Hirata et al. |
| 2010/0264117 | A1 | 10/2010 | Ohmi et al. |
| 2010/0269924 | A1 | 10/2010 | Yasuda |
| 2011/0019332 | A1 | 1/2011 | Chistyakov |

(56) References Cited

U.S. PATENT DOCUMENTS

| | | |
|---|---|---|
| 2011/0031111 A1 | 2/2011 | Kobayashi |
| 2011/0094596 A1 | 4/2011 | Sugiyama et al. |
| 2011/0135821 A1 | 6/2011 | Ding |
| 2011/0253225 A1 | 10/2011 | Beeby et al. |
| 2011/0265883 A1 | 11/2011 | Cruse et al. |
| 2011/0287631 A1 | 11/2011 | Yamamoto |
| 2011/0303696 A1 | 12/2011 | Kelekar et al. |
| 2012/0031500 A1 | 2/2012 | Hirose et al. |
| 2012/0034786 A1 | 2/2012 | Dhindsa et al. |
| 2012/0097266 A1 | 4/2012 | Cobb et al. |
| 2012/0149213 A1 | 6/2012 | Nittala et al. |
| 2012/0152364 A1 | 6/2012 | Hashimoto et al. |
| 2012/0156363 A1 | 6/2012 | Quinn et al. |
| 2012/0174990 A1 | 7/2012 | Yasuda |
| 2012/0190208 A1 | 7/2012 | Ozu et al. |
| 2012/0238102 A1 | 9/2012 | Zhang et al. |
| 2012/0238103 A1 | 9/2012 | Zhang et al. |
| 2012/0244715 A1 | 9/2012 | Lebouitz et al. |
| 2012/0247386 A1 | 10/2012 | Sanchez et al. |
| 2012/0289057 A1 | 11/2012 | DeDontney |
| 2012/0298221 A1 | 11/2012 | Takeuchi et al. |
| 2012/0305184 A1 | 12/2012 | Singh et al. |
| 2012/0328780 A1 | 12/2012 | Yamagishi |
| 2013/0008607 A1 | 1/2013 | Matsumoto et al. |
| 2013/0025715 A1 | 1/2013 | Yamaguchi et al. |
| 2013/0029494 A1 | 1/2013 | Sasaki et al. |
| 2013/0029496 A1 | 1/2013 | Bauer et al. |
| 2013/0045605 A1 | 2/2013 | Wang et al. |
| 2013/0085618 A1 | 4/2013 | Ding |
| 2013/0104996 A1 | 5/2013 | Oh et al. |
| 2013/0106286 A1 | 5/2013 | Banna et al. |
| 2013/0131300 A1 | 5/2013 | Olmscheid et al. |
| 2013/0145816 A1 | 6/2013 | Lowe |
| 2013/0157388 A1 | 6/2013 | Grimbergen |
| 2013/0220433 A1 | 8/2013 | Sawada et al. |
| 2013/0255784 A1 | 10/2013 | Ye et al. |
| 2013/0270997 A1 | 10/2013 | Zhao et al. |
| 2013/0288477 A1 | 10/2013 | Rieschl et al. |
| 2014/0033828 A1 | 2/2014 | Larson et al. |
| 2014/0080308 A1 | 3/2014 | Chen et al. |
| 2014/0120737 A1 | 5/2014 | Swaminathan et al. |
| 2014/0141621 A1 | 5/2014 | Ren et al. |
| 2014/0144471 A1 | 5/2014 | Kahlon et al. |
| 2014/0182689 A1 | 7/2014 | Shareef et al. |
| 2014/0213055 A1 | 7/2014 | Himori et al. |
| 2014/0248780 A1 | 9/2014 | Ingle et al. |
| 2014/0262038 A1 | 9/2014 | Wang et al. |
| 2014/0273460 A1 | 9/2014 | Reyland et al. |
| 2015/0010381 A1 | 1/2015 | Cai |
| 2015/0017810 A1 | 1/2015 | Guha |
| 2015/0059859 A1 | 3/2015 | Takahashi et al. |
| 2015/0181684 A1 | 6/2015 | Banna et al. |
| 2015/0184287 A1 | 7/2015 | Tsung et al. |
| 2015/0287572 A1 | 10/2015 | Daugherty et al. |
| 2015/0340209 A1 | 11/2015 | Koltonski |
| 2015/0371831 A1 | 12/2015 | Rozenzon et al. |
| 2016/0111258 A1 | 4/2016 | Taskar et al. |
| 2016/0181116 A1 | 6/2016 | Berry, III et al. |
| 2016/0211165 A1 | 7/2016 | McChesney et al. |
| 2016/0211166 A1 | 7/2016 | Yan et al. |
| 2016/0215392 A1 | 7/2016 | Yudovsky et al. |
| 2016/0247688 A1 | 8/2016 | Zhu et al. |
| 2016/0293431 A1 | 10/2016 | Sriraman et al. |
| 2017/0018407 A1 | 1/2017 | Kondo |
| 2017/0032982 A1 | 2/2017 | Drewery et al. |
| 2017/0069511 A1 | 3/2017 | Yang et al. |
| 2017/0110335 A1 | 4/2017 | Yang et al. |
| 2017/0200586 A1 | 7/2017 | Treadwell et al. |
| 2017/0213758 A1 | 7/2017 | Rice et al. |
| 2017/0236688 A1 | 8/2017 | Caron et al. |
| 2017/0236694 A1 | 8/2017 | Eason et al. |
| 2017/0236741 A1 | 8/2017 | Angelov et al. |
| 2017/0236743 A1 | 8/2017 | Severson et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2018/0053629 A1 | 2/2018 | Zhang et al. |
| 2019/0013232 A1 | 1/2019 | Yan et al. |

FOREIGN PATENT DOCUMENTS

| | | |
|---|---|---|
| CN | 102315150 A | 1/2012 |
| CN | 103730318 A | 4/2014 |
| CN | 104299929 A | 1/2015 |
| CN | 104752141 A | 7/2015 |
| CN | 104851832 A | 8/2015 |
| CN | 105336561 A | 2/2016 |
| CN | 107093569 A | 8/2017 |
| EP | 0424299 A2 | 4/1991 |
| EP | 0424299 A3 | 8/1991 |
| EP | 0838842 A2 | 4/1998 |
| JP | 2001-230239 A | 8/2001 |
| JP | 2015201552 A | 11/2015 |
| KR | 20040050080 A | 6/2004 |
| KR | 20050008792 A | 1/2005 |
| KR | 20080023569 A | 3/2008 |
| KR | 20130137962 A | 12/2013 |
| KR | 20140001540 A | 1/2014 |
| KR | 101974420 B1 | 5/2019 |
| KR | 101974422 B1 | 5/2019 |
| TW | 506234 B | 10/2002 |
| TW | 201207933 A | 2/2012 |
| TW | 201324653 A | 6/2013 |
| TW | 201436089 A | 9/2014 |
| WO | WO-0040776 A1 | 7/2000 |
| WO | WO-2007008509 A2 | 1/2007 |
| WO | WO-2011051251 A1 | 5/2011 |
| WO | WO-2013123617 A1 | 8/2013 |
| WO | WO-2014068886 A1 | 5/2014 |
| WO | WO-2014163742 A1 | 10/2014 |

OTHER PUBLICATIONS

Dusa, Mircean et al., "Pitch Doubling Through Dual Patterning Lithography Challenges in Integration and Litho Budgets," Optical Microlithography XX, vol. 6520, 65200G, (2007); 10 pages.

U.S. Office Action dated Oct. 5, 2015 issued in U.S. Appl. No. 14/576,020 [LAMRP146].

Blain et al. (Jul./Aug. 1996) "Role of nitrogen in the downstream etching of silicon nitride," Journal of Vacuum Science & Technology A, 14(4):2151-2157.

Blain (Mar./ Apr. 1999) "Mechanism of nitrogen removal from silicon nitride by nitric oxide," Journal of Vacuum Science & Technology A, 17(2):665-667.

Kastenmeier et al. (Nov/Dec. 1999) "Highly selective etching of silicon nitride over silicon and silicon dioxide," J. Vac. Sci. Technol. A, American Vacuum Society, I7 (6):3179-3184.

Kastenmeier et al. (Sep./Oct. 1996) "Chemical dry etching of silicon nitride and silicon dioxide using CF4/02/N2 gas mixtures," J. Vac. Sci. Technol. A14(5):2802-2813.

Oehrlein et al. (1996) "Study of plasma-surface interactions: chemical dry etching and high-density plasma etching," Plasma Sources Sci. Technol. 5:193-199.

Tajima et al. (2013) "Room-Temperature Si Etching in NO/F2 Gases and the Investigation of Surface Reaction Mechanisms," The Journal of Physical Chemistry C, 117:5118-5125.

Yun et al. (2007) "Large Etch Rate Enhancement by NO-Induced Surface Chemical Reaction during Chemical Dry Etching of Silicon Oxide in F2 Remote Plasmas," Journal of the Electrochemical Society, 154(4):D267-D272.

U.S. Final Ofice Action dated Feb. 26, 2016 issued in U.S. Appl. No. 14/576,020 [LAMRP146].

U.S. Office Action dated Sep. 23, 2016 issued in U.S. Appl. No. 14/576,020 [LAMRP146].

European Extended Search Report dated May 30, 2016 issued in EP 15 199 363.1 [LAMRP146EP].

U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).

(56) References Cited

OTHER PUBLICATIONS

U.S. Appl. No. 62/065,497, entitled "Gas Supply Delivery Arrangement Including a Gas Splitter for Tunable Gas Flow Control," filed Oct. 17, 2014, in the names of Mark Taskar et al. (Year: 2014).
MP125E N-470 Linear Drive User Manual Version 1.1.0; Date Sep. 18, 2014; 54 Pages; Physik Instrumente (PI) GmbH & Co. KG, Auf der Roemerstr, 1, 76228 Karlsruhe, Germany.
First Office Action dated Dec. 29, 2017 corresponding to Chinese Patent Application No. 201610032252.1, 12 pages.
First Office Action dated Aug. 2, 2018 corresponding to Chinese Patent Application No. 201710036188.9, 7 pages.
First Chinese Office Action for Chinese Application No. CN201710076420.1 dated Dec. 17, 2019. No translation provided. 11 pages.

* cited by examiner

CHAMBER MEMBER OF A PLASMA SOURCE AND PEDESTAL WITH RADIALLY OUTWARD POSITIONED LIFT PINS FOR TRANSLATION OF A SUBSTRATE C-RING

CROSS-REFERENCE TO RELATED APPLICATIONS

This application claims the benefit of U.S. Provisional Application No. 62/294,574, filed on Feb. 12, 2016. The entire disclosure of the application referenced above is incorporated herein by reference.

FIELD

The present disclosure relates to substrate processing, and more particularly to structures of a plasma source and pedestal.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on a substrate such as a semiconductor wafer. The substrate processing systems typically include a substrate processing chamber, a gas distribution device and a substrate support. During processing, the substrate is arranged on the substrate support. Different gas mixtures may be introduced into the substrate processing chamber and radio frequency (RF) plasma may be generated to activate chemical reactions. The RF plasma may be an inductively coupled plasma (ICP) or a transformer coupled plasma (TCP). The ICP or TCP may be provided by a plasma source as a result of charging one or more coils. The plasma source includes an upper portion of a substrate processing chamber and the one or more coils.

A chamber member of an ICP source may be cylindrically-shaped or dome-shaped. A chamber member of a TCP source may be flat-shaped. A cylindrically-shaped chamber member of an ICP source has coils located around a circumference of the chamber member. A dome-shaped chamber member of an ICP source is spherically-shaped and has coils disposed above the chamber member. A flat-shaped chamber member of a TCP source includes a flat circular dielectric window above which coils are mounted.

Plasma sources with cylindrical, dome and flat shaped chamber members have associated disadvantages. The disadvantage of the cylindrically-shaped chamber member is that all of the corresponding coils are located around the circumference of a cylinder, which does not allow for adjusting a radial plasma density from a center (e.g., vertical centerline extending through a center of the cylindrically-shaped chamber) to an outer circumferential edge of the cylindrically-shaped chamber member.

The dome-shaped chamber member may have a center mounted coil and an outer mounted coil. The center mounted coil may be located near a top and center of the dome-shaped chamber member. The outer mounted coil may be located further down on and near a perimeter of the dome-shaped chamber. The disadvantage of the dome-shaped chamber member is that a larger distance exists between the center mounted coil and a center of a substrate as compared to a distance between the outer mounted coil and the substrate. This longer distance in the center of the corresponding plasma source can result in longer residence times for plasma species generated in the center versus the outer edge. This affect is more pronounced when high pressure gases are supplied and/or when electronegative gases are supplied due to localized areas with high density plasma.

The disadvantage of the flat-shaped chamber member is that the corresponding coils are typically located a considerable distance away from the plasma due to a thick dielectric window (e.g., 1-2 inches in thickness). The dielectric window is thick to withstand mechanical forces generated by a difference in pressure across the dielectric window. The physical separation between the chamber member and the plasma reduces efficiency of the corresponding TCP source because mutual inductance between the coils and plasma is decreased. This results in increased current flowing through the coils and increased copper loss (i.e. increased magnetic field loss). The further away the coils are from an interior chamber region of the chamber member the more magnetic field loss and thus the more current needed to provide the required magnetic field in the interior chamber region.

SUMMARY

A chamber member of a plasma source is provided and includes a sidewall, a transition member, a top wall and an injector connecting member. The sidewall is cylindrically-shaped and surrounds an upper region of a substrate processing chamber. The transition member is connected to the sidewall. The top wall is connected to the transition member. The injector connecting member is connected to the top wall, positioned vertically higher than the sidewall, and configured to connect to a gas injector. Gas passes through the injector connecting member via the gas injector and into the upper region of the substrate processing chamber. A center height to low inner diameter ratio of the chamber member is 0.25-0.5 and/or a center height to outer height ratio of the chamber member is 0.4-0.85.

In other features, a pedestal is provided and includes a radio frequency electrode, lift pins, a c-ring, insulators, and a ground shield. The lift pins are located radially outside the radio frequency electrode. The c-ring receives a substrate, where the lift pins move the c-ring relative to the pedestal. The radio frequency electrode, the lift pins, and the insulators are disposed in the ground shield, where the insulators isolate the radio frequency electrode from the lift pins and the ground shield.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Examples are disclosed herein for improved etching uniformity of a substrate including edge uniformity and tunable radial uniformity. The improved etching uniformity is provided with reduced risk of substrate damage due to plasma and allows for various options for injecting gas into a substrate processing chamber. The examples include chamber members of plasma sources with geometries and corresponding coil configurations that allow for controlled and uniform generation of plasma across a substrate. The plasma sources allow for controlled densities of the plasma near a center of the plasma sources unlike traditional plasma sources with dome-shaped chamber members. The disclosed plasma sources place center coils closer to substrates than traditional plasma sources with dome-shaped chamber members. This reduces residence time of plasma between top center surfaces of the disclosed chamber members and substrates. Residence time refers to an amount of time for plasma to pass between areas adjacent to the top center surfaces and centers of corresponding substrates.

The examples also provide pedestal designs that allow for easy removal of substrates from pedestals. The pedestal designs include lift pins that do not pass through an RF electrode and/or plate. This improves thermal and RF uniformity across the pedestal and backsides (sides facing the pedestal) of substrates. The pedestal designs also reduce risk of arcing in lift pin areas since the lift pins are not located in areas where RF energy is emitted.

Figure 1:
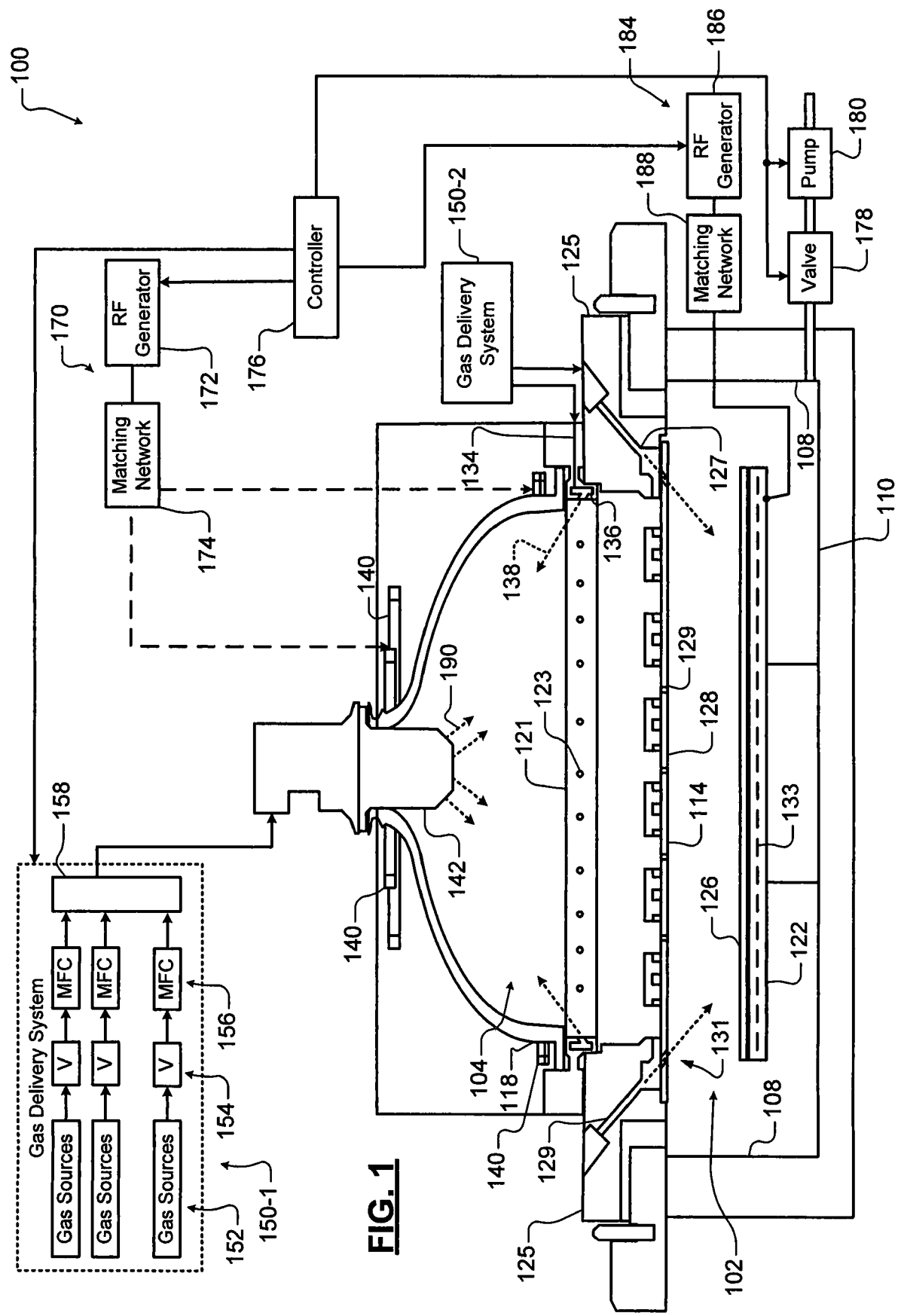
FIG. 1 is a functional block diagram of an example of a substrate processing system according to an embodiment of the present disclosure.

Referring now to FIG. 1, an example of a substrate processing system 100 with a substrate processing chamber 101 for etching a film layer of a substrate according to the present disclosure is shown. While a specific substrate processing chamber is shown and described, the methods described herein may be implemented on other types of substrate processing systems. Although FIG. 1 shows the substrate processing system 100 having various features, one or more of these features may be different and/or may not be included. Examples of alternative embodiments are shown and described with respect to FIGS. 2-17.

Referring again to FIG. 1, the substrate processing chamber 101 includes a lower chamber region 102 and an upper chamber region 104. The lower chamber region 102 is defined by chamber sidewall surfaces 108, a chamber bottom surface 110 and a lower surface of a gas distribution device 114. An upper portion (or chamber member) 118 of the substrate processing chamber 101 in combination with corresponding coils (examples of which are described below) may be referred to as a plasma source and may provide an ICP.

The upper chamber region 104 is defined by an upper surface of the gas distribution device 114 and an inner surface of the upper portion 118. In some examples, the upper portion 118 rests on a first annular support 121. In some examples, the first annular support 121 includes one or more spaced holes 123 for delivering process gas to the upper chamber region 104, as will be described further below. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to (i) the one or more spaced holes 123, and/or (ii) one or more channels or injectors 136, which direct the gas upward (indicated by arrow 138) to mix with gas and/or plasma in the upper chamber region 104.

The first annular support 121 may be disposed above and/or on a second annular support 125. The second annular support 125 defines one or more spaced holes 127 for delivering process gas from a gas flow channel 129 to the lower chamber region 102. In some examples, holes 131 in the gas distribution device 114 align with the holes 127. In other examples, the gas distribution device 114 has a smaller diameter and the holes 131 are not needed. In some examples, the process gas is delivered by the one or more spaced holes 127 in a downward direction towards a substrate 126 at an acute angle relative to the plane including the gas distribution device 114, although other angles/directions may be used.

In other examples, the upper chamber region 104 is cylindrical with a flat top surface. In still other examples, a single chamber may be used with a spacer located between a showerhead 128 and a substrate support 122.

The substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by heating elements (or a heater plate) 133, an optional cooling plate with fluid channels and one or more sensors (not shown); although any other suitable substrate support temperature control system may be used.

In some examples, the gas distribution device 114 includes a showerhead (for example, a plate 128 having a plurality of spaced holes 129 is shown). The plurality of spaced holes 129 extend from the upper surface of the plate 128 to the lower surface of the plate 128. In some examples, the spaced holes 129 have a diameter in a range from 0.4" to 0.75" and the showerhead is made of a conducting material such as aluminum or a non-conductive material such as ceramic with an embedded electrode made of a conducting material.

One or more inductive coils 140 may be arranged around an outer portion of the upper portion 118. When energized, the one or more inductive coils 140 create an electromagnetic field inside of the upper portion 118. In some examples, an upper coil and a lower coil are used. A gas injector 142 injects one or more gas mixtures from a gas delivery system 150-1.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels 129 and/or 134 (in addition to or instead of etch gas from the gas injector 142).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels 129 and 134 and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the upper portion 118 by the one or more inductive coils 140. One or more gas mixtures are introduced from a top portion of the substrate processing chamber 101 using the gas injector 142 (and/or holes 123) and plasma is confined within the upper portion 118 using the gas distribution device 114.

Confining the plasma in the upper portion 118 allows volume recombination of plasma species and effusing desired etchant species through the gas distribution device 114. In some examples, there is no RF bias applied to the substrate 126. As a result, there is no active sheath on the substrate 126 and ions are not hitting the substrate 126 with any finite energy. Some amount of ions will diffuse out of the plasma region through the gas distribution device 114. However, the amount of plasma that diffuses is an order of magnitude lower than the plasma located inside the upper portion 118. Most of ions in the plasma are lost by volume recombination at high pressures. Surface recombination loss at the upper surface of the gas distribution device 114 also lowers ion density below the gas distribution device 114.

In other examples, the substrate processing system 100 includes an RF bias generator 186 and a matching network 188. The RF bias generator 186 generates a RF bias that can be used to create plasma between the gas distribution device 114 and the substrate support 122 or to create a self-bias on the substrate 126 to attract ions. The controller 176 may control the RF bias. The output frequencies of the RF bias generator 186 and/or the matching network 188 may be 0.5-60 mega-hertz (MHz).

Although the substrate processing system 100 is primarily described as operating with an ICP source, the substrate processing system 100 may also or alternatively operate as a capacitively-coupled plasma (CCP) reactor and/or a parallel plate reactor, where a RF electrode of the substrate support 122 is serves as a lower plate and the showerhead 128 or the chamber member of the plasma source serves as the upper plate depending on whether the showerhead 128 is included.

Figure 2:
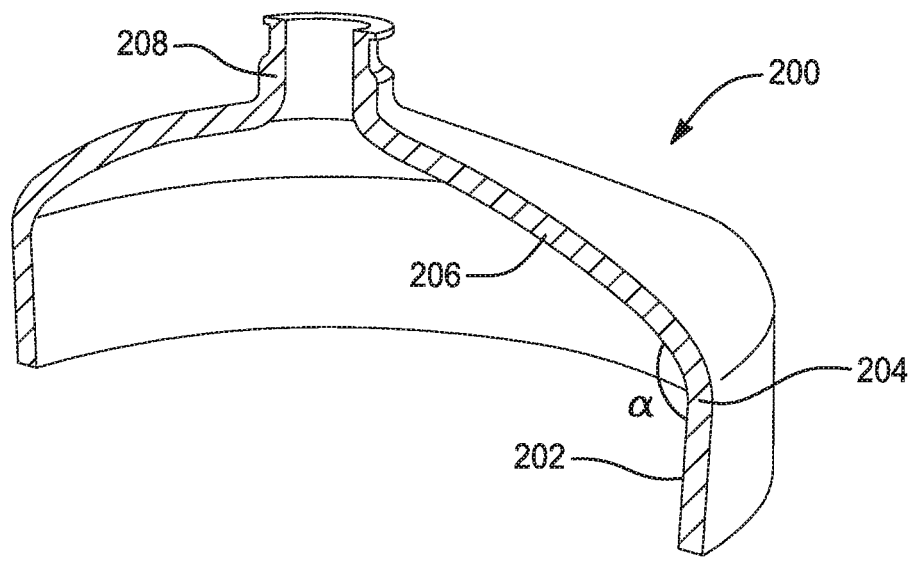
FIG. 2 is a perspective cross-sectional view of an upper portion of a substrate processing chamber according to an embodiment of the present disclosure.

Referring now also to FIG. 2, which shows a perspective cross-sectional view of an upper portion 200 of a substrate processing chamber. The upper portion 200 may replace the upper portion 118 of FIG. 1 and may be referred to as a chamber portion or member of a plasma source. The upper portion 200 may be formed of ceramic, quartz, and/or other suitable dielectric material. The upper portion 200 may be referred to as a "squashed" chamber portion. The upper portion 200 is not dome-shaped, spherically-shaped, or hemispherically-shaped. The upper portion 200 includes a sidewall 202, a transition member 204, a top wall 206, and an injector connecting member 208. Although shown as a single element, the upper portion 200 may include multiple distinct elements. For example, the elements 202, 204, 206, 208 may be separately formed and connected together or may be formed as a part of a single element, as shown.

The sidewall 202 may be cylindrically-shaped and oriented in a vertical direction relative to the first annular support 121, the substrate support 122, and/or other horizontally oriented element of the substrate processing system 100. The transition member 204 connects the sidewall 202 to the top wall 206 and sets an angle α between the sidewall 202 and the top wall 206. The angle α may be between 100-145° depending on which portion of the top wall the angle α is being determined from. In one embodiment, the angle α is 115-135°. A cross-section of the top wall 206 and/or a portion of the cross-section of the top wall 206 may be semi-linear or linear shaped. The top wall 206 extends between the transition member 204 and the injector connecting member 208. The top wall 206 may be concave-shaped and/or hemisperically-shaped. The top wall 206 is not spherically-shaped. The elements 202, 204, 206, and/or 208 may have a same thickness.

In another embodiment, the angle α between sidewall 202 and the top wall 206 may be smaller than shown in FIG. 2 and/or a cross-section of the top wall 206 may be more linear-shaped than shown in FIG. 2. A cross-section of the top wall may be linear-shaped between the transition member 204 and the injector connecting member 208. As a result, a top portion of the upper portion 200 may be flatter in shape than shown in FIG. 2.

Figure 3:
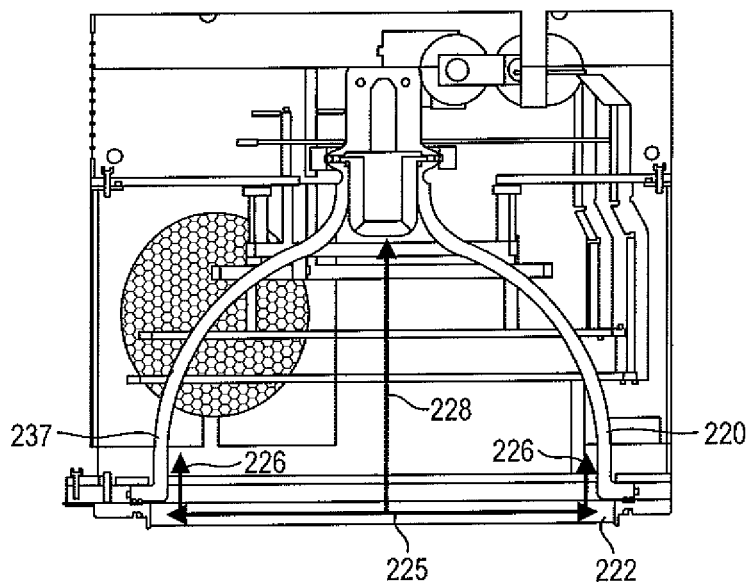
FIG. 3 is a cross-sectional side view of a dome-shaped chamber portion of a traditional plasma source.
Figure 4:
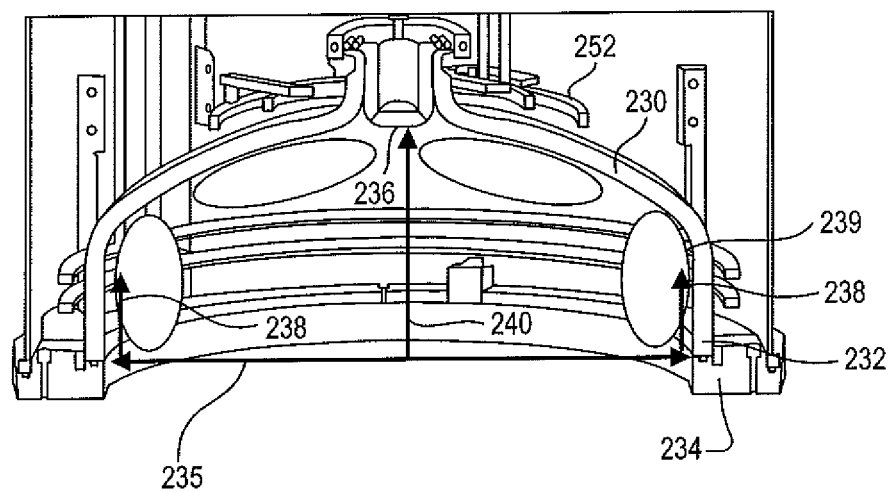
FIG. 4 is a cross-sectional side view of the upper portion of the substrate processing chamber of FIG. 2 identifying certain heights and a diameter.

Referring now to FIGS. 3-4, which show cross-sectional views of a dome-shaped chamber portion 220 of a traditional plasma source and a chamber portion 230 of a plasma source disclosed herein. The dome-shaped chamber portion 220 may have a center height to low inner diameter ratio of 0.6. The center height refers to a height between (i) a bottom of the dome-shaped chamber portion 220 or a top surface of the support plate 222 and (ii) a bottom of the injector 224. The low inner diameter refers to an inner diameter at a bottom of the dome-shaped chamber portion 220. The low inner diameter is shown by arrow 225. The chamber portion 230 may have a center height to low inner diameter ratio of 0.25-0.5 depending on a height of sidewall 232. The center height refers to a height between (i) a bottom of the chamber portion 230 or a top surface of the support plate 234 and (ii) a bottom of the injector 236. The low inner diameter is identified by arrow 235. In one embodiment, the center height to low inner diameter ratio of the chamber portion 230 is 0.35-0.45. In another embodiment, the center height to low inner diameter ratio is 0.4. In one embodiment, the low inner diameter 235 is greater than or equal to a diameter of a substrate being processed below the chamber portion 230.

The dome-shaped chamber portion 220 may have an outer height to center height ratio of 0.18. The chamber portion 230 may have an outer height to center height ratio of 0.4-0.85. In one embodiment, the chamber portion 230 has an outer height to center height ratio of 0.5-0.6. In another embodiment, the chamber portion 230 has an outer height to center height ratio of 0.55. The outer height for the dome-shaped chamber portion 220 refers to height between (i) a bottom of the dome-shaped chamber portion 220 or a top surface of the support plate 222 and (ii) a height at a point along the inner surface of the dome-shaped chamber portion 220 at which the dome-shaped chamber portion 220 begins to cure inward (an example point 237 is shown). The outer height and center height are represented by arrows 226 and 228. The outer height for the chamber portion 230 may refer to height between (i) a bottom of the chamber portion 230 or a top surface of the support plate 222 and (ii) a height at a point along the inner surface of the chamber portion 230 at which the chamber portion 230 begins to curve inward (an example point 239 is shown). The outer height may be equal to a height of the sidewall 232. The outer height and the center height are represented by arrows 238, 240.

Figure 5:
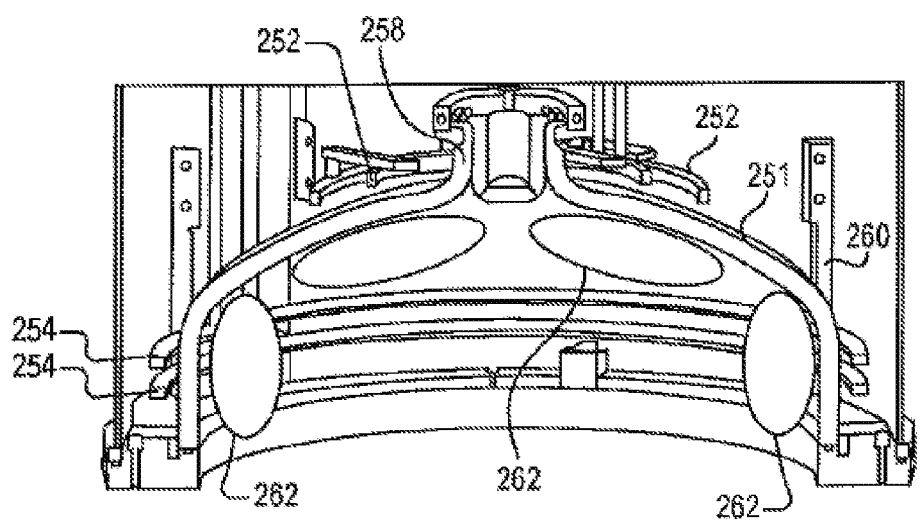
FIG. 5 is a cross-sectional side view of a plasma source including the upper portion of the substrate processing chamber of FIG. 2 illustrating an example coil implementation according to an embodiment of the present disclosure.

FIG. 5 shows a plasma source 250 that includes the upper portion 200, center (inner) coils 252 and outer (edge) coils 254. The center coils 252 are located above a center area of the chamber member 251, around an injector 256 and an injector connecting member 258, and near a top of the plasma source 250. The outer coils 254 are located around a sidewall 260 near a bottom of the plasma source 250. The coils 252, 254 provide radial control of plasma density. The ellipsis 262 represents generated plasma.

The geometries of the chamber portions of the herein disclosed plasma sources provide good plasma generation near an outer edge of plasma sources due to outer coils being placed radially outward from generated plasma. The geometries also enable good control of plasma density near a center of the chamber portions using center coils located near and above center areas of the plasma sources. These configurations also locate center plasma closer to a substrate reducing (i) residence time of plasma in center areas, and as a result (ii) differences in residence times between plasma in the center areas and plasma near substrate edges. The reduced residence times in the center areas prevents changes in the plasma that may occur during longer residence times. For example, when plasma is generated atoms may be separated. During longer residence times, some of the atoms may recombine thereby reducing effectiveness of the plasma.

The disclosed squashed-shaped design also allows coils to be closer to plasma as compared to a flat TCP configuration due to the ability to support pressure on the upper portions of substrate processing chambers with thinner wall thicknesses. For example, the thicknesses of the elements 202, 204, 206, 208 of FIG. 2 may be thinner than wall or dielectric window thicknesses of the flat TCP configuration. The elements 202, 204, 206, 208 may have thicknesses of 0.4-0.6 inches. In one embodiment, the thickness of each of the elements 202, 204, 206, 208 is 0.5 inches. The thinner upper portions of the plasma sources enables the coils to be placed closer to the plasma which increases mutual inductance and plasma source power efficiencies as less current may be supplied to the coils.

The squashed dome shape provides an efficient plasma source with good uniformity and the ability to radially tune the plasma density. The plasma sources disclosed herein provide smaller equipment foot prints with increased product yields due to improved uniformity characteristics.

Figure 6:
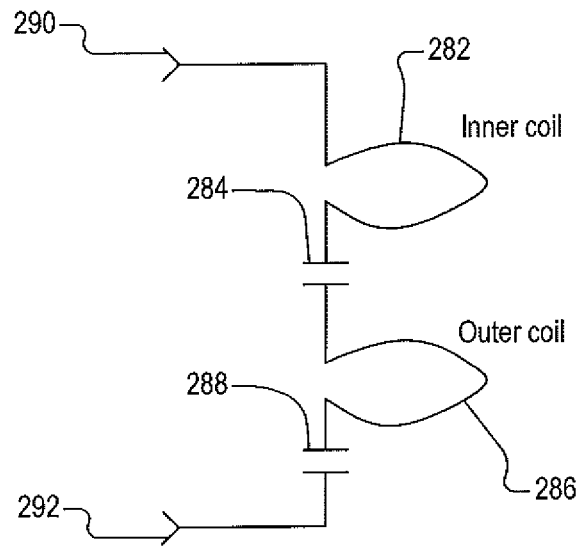
FIG. 6 is a schematic view of a serial coil configuration according to an embodiment of the present disclosure.

FIG. 6 shows a serial coil configuration 280. The serial coil configuration 280 includes one or more inner (or center) coils 282, a first capacitance 284, one or more outer (or edge) coils 286, and a second capacitance 288. The inner coils 282 may be the center coils 252 of FIG. 5. The outer coils 286 may be the edge coils 260 of FIG. 5. The inner coil 282 may receive current from a power source, such as the RF generator 172 of FIG. 1, at terminal 290. The second capacitance may be connected to a ground terminal 292. The coils 282, 286 are connected in a series configuration with capacitances 284,288 to balance voltages near coil ends relative to ground. The serial order of the components may be changed between the terminal 290 and the ground terminal 292.

Figure 7:
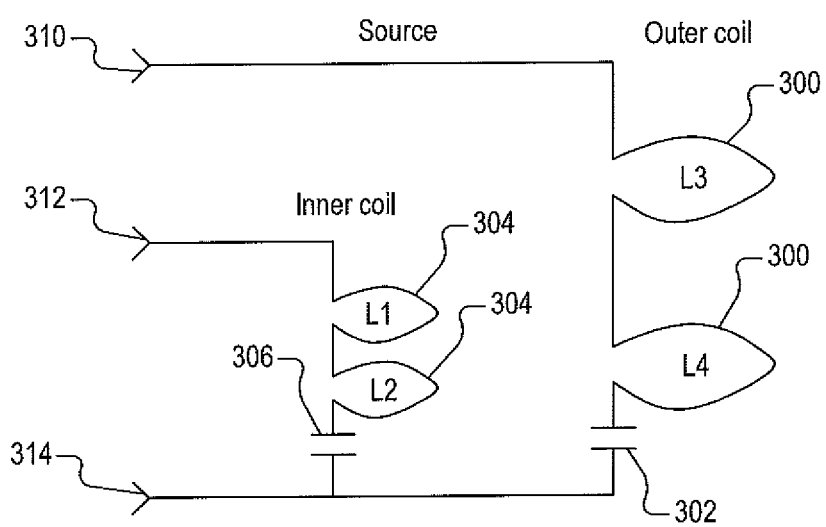
FIG. 7 is a schematic view of a parallel coil configuration according to an embodiment of the present disclosure.

As an alternative, the inner and outer coils of any of the plasma sources disclosed herein may be connected in a parallel configuration as shown in FIG. 7. Outer coils 300 are shown connected in series with a first capacitance 302. Inner coils 304 are shown connected in series with a second capacitance 306. The parallel configuration allows the outer coils 300 to be controlled independent of the inner coils 304. The outer coils 300 may receive a different voltage and/or amount of current than the coils 304. Supply terminals 310, 312 are shown and may be connected to the matching network 174 of FIG. 1. The capacitances 302, 306 may be connected to ground. The serial order of the components may be changed between the terminals 310, 312 and the ground terminals 314.

Figure 8:
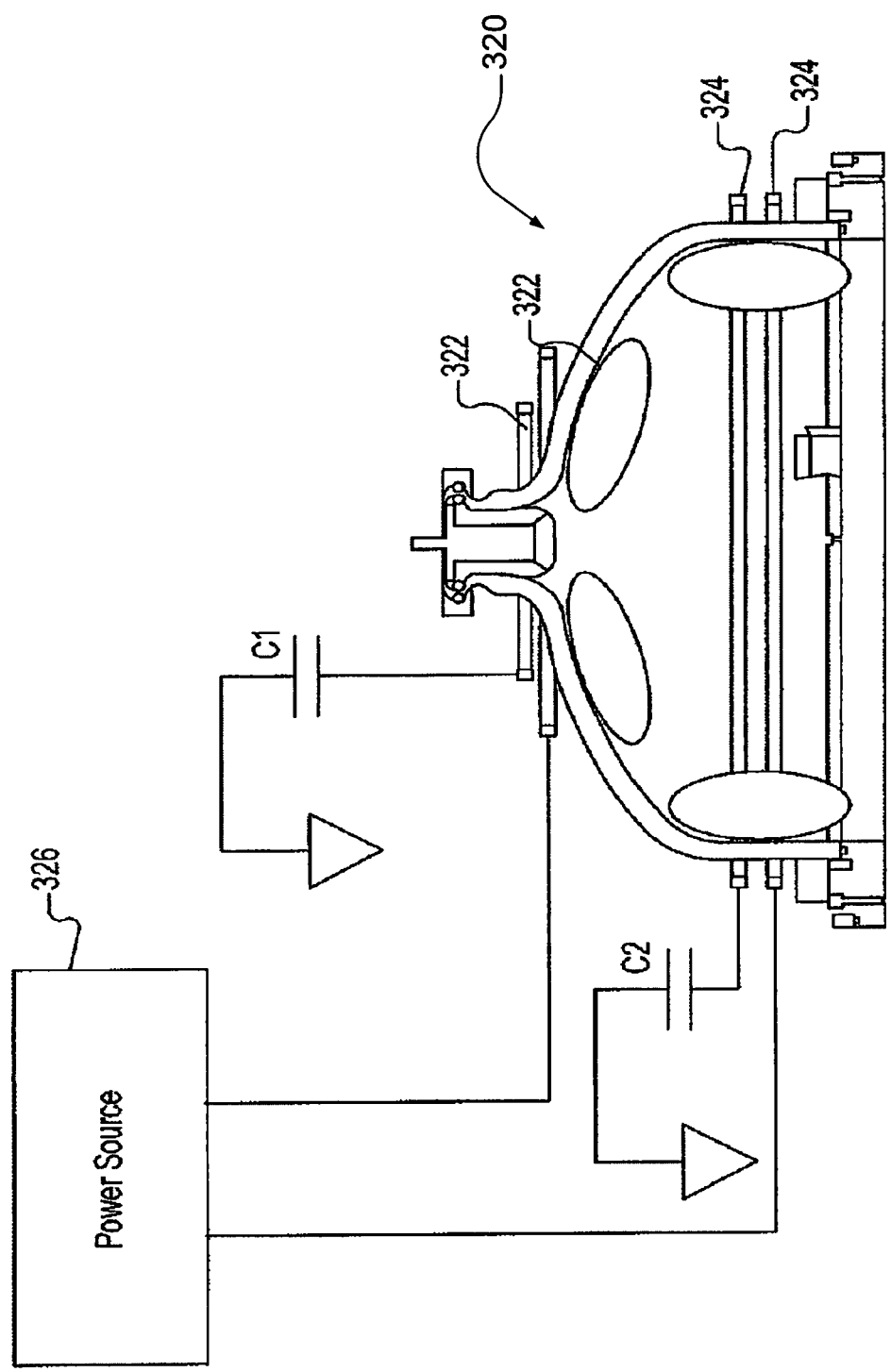
FIG. 8 is a functional block and cross-sectional side view of a chamber portion of a plasma source having independently controlled coils according to an embodiment of the present disclosure.

FIG. 8 shows a chamber portion 320 of a plasma source having independently controlled coils 322, 324. The coils 322 and a first capacitance C1 may be connected in series. The coils 324 and a second capacitance C2 may be connected in series. The coils 322 and capacitance C1 are connected in parallel to the coils 324 and capacitance C2. A power source 326 may include the RF generator 172 and the matching network 174 of FIG. 1 and supplies power independently to the coils 322, 324. In one embodiment, the coils 322, 324 are powered in such a way that a ratio of power passing through coils 322 to power passing through coils 324 is controlled to alter radial density of plasma across a substrate.

Figure 9:
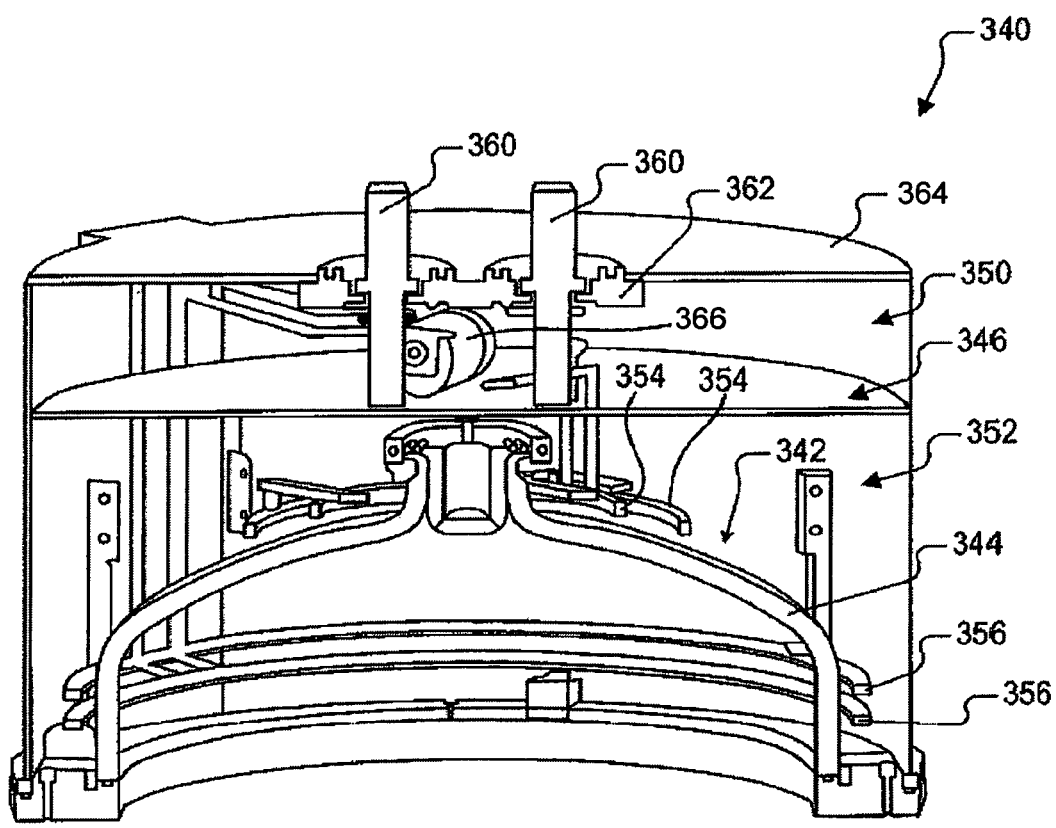
FIG. 9 is a cross-sectional side view of a portion of a chamber including a plasma source and a ground separation shield according to an embodiment of the present disclosure.

FIG. 9 shows a portion of a protective enclosure 340. A plasma source 342 is located within the protective enclosure 340 and has upper chamber portion 344. The protective enclosure 340 includes a ground separation shield 346. The ground separation shield 346 divides an interior of the protective enclosure 340 into a first area 350 and a second area 352. RF components such as capacitances (e.g., the capacitances of FIGS. 6-8 and/or other RF components) are located in the first area 350. The plasma source 342, which includes the upper chamber portion 344 and coils 354, 356, is located in the second area 352.

As shown, the capacitances are located above the ground shield 346 and the plasma source 342 is located below the ground shield 346. The ground shield 346 isolates the electromagnetic fields created by the RF components located above the ground shield 346 and corresponding connections from the plasma source 342.

Connector pins 360 may be included in the first area 350 and connect and/or plug into the matching network 174 of FIG. 1 and/or power source 326 of FIG. 8. The pins 360 may be inserted through insulators 362 in a top wall 364 of the protective enclosure 340. The pins 360 may connect to the capacitances (an example capacitance 366 is shown).

Figure 10:
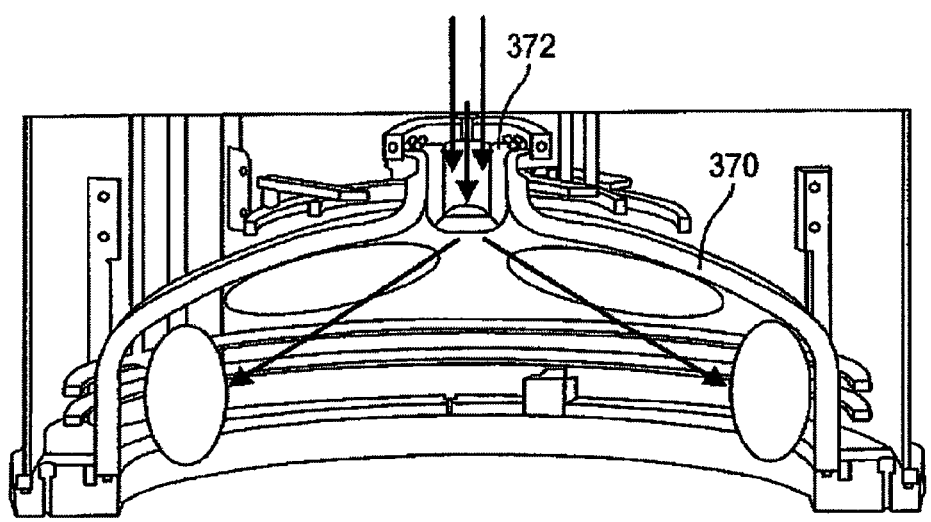
FIG. 10 is a cross-sectional side view of a chamber portion of a plasma source including a diffuser according to an embodiment of the present disclosure.

FIG. 10 shows a chamber portion 370 of a plasma source including a diffuser 372. The diffuser 372 may include one or more channels for receiving gas and have openings for spreading the received gas into the chamber portion 370. If only one channel is included, the received gases may be provided to all of the holes in the diffuser 372. If more than one channel is included, than the gas in each of the channels may be provided to corresponding ones of the holes in the diffuser 372. The diffuser 372 may have any number of holes. As a result, each injected gas may be passed from one or more holes of the diffuser 372 and into the chamber portion 370.

Figure 11:
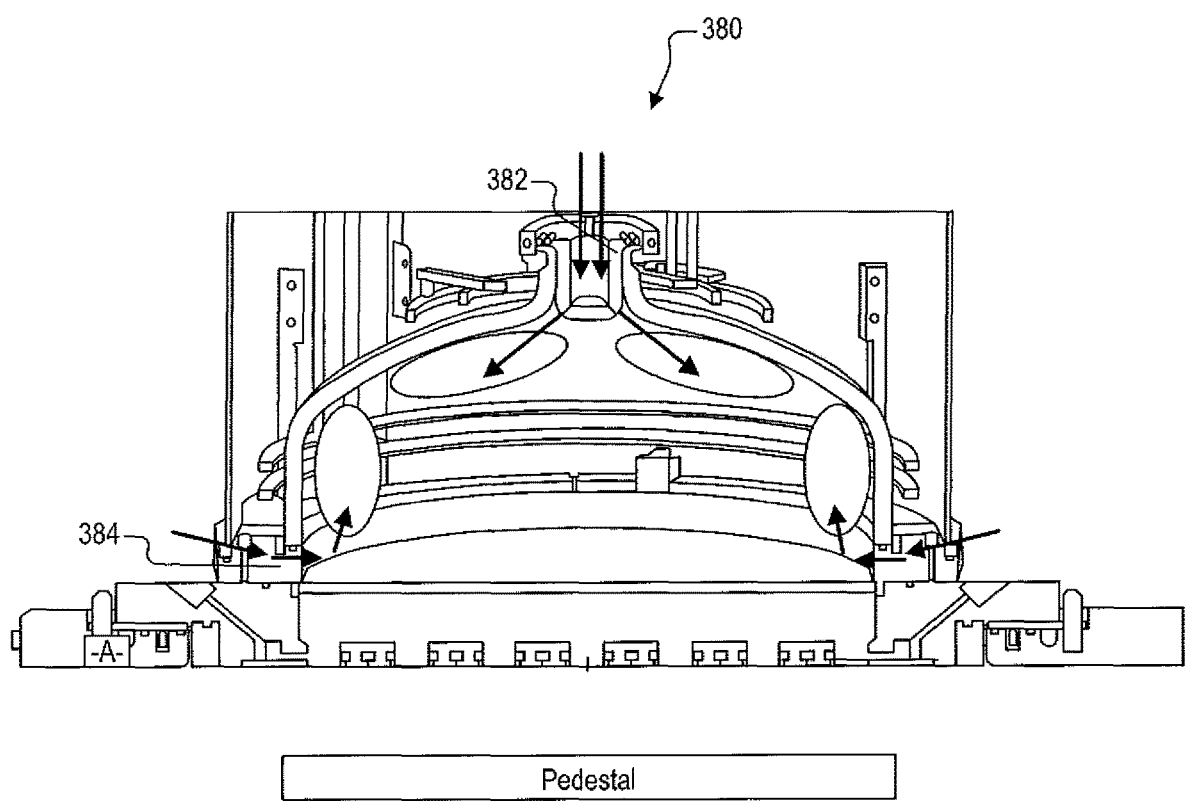
FIG. 11 is a cross-sectional side view of a chamber portion of a plasma source including a diffuser and a side upward injector according to an embodiment of the present disclosure.

FIG. 11 shows a chamber portion 380 of a plasma source including a diffuser 382 and a side upward injector 384. In another embodiment, gas injection into the chamber portion 380 may be from one or more holes in the diffuser 382 and/or from one or more side upward injectors (e.g., the side upward injector 384).

Figure 12:
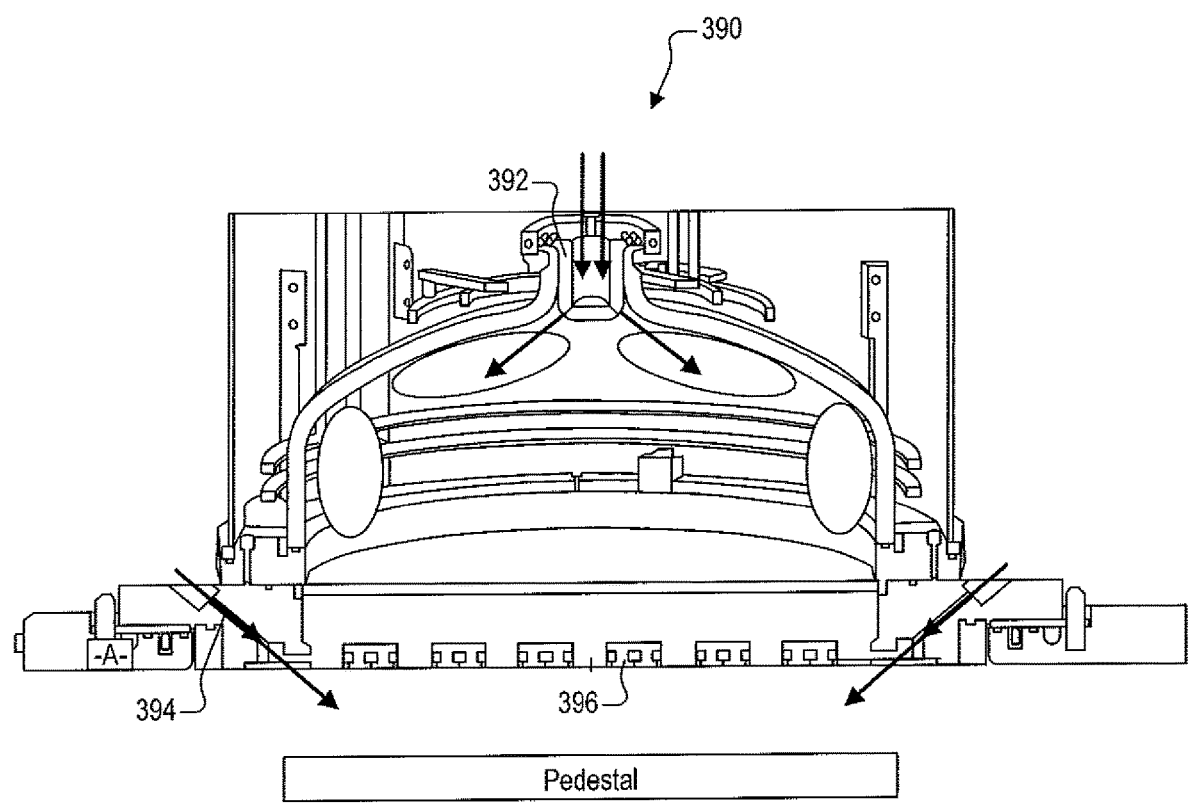
FIG. 12 is a cross-sectional side view of a chamber portion of a plasma source including a diffuser and a side downward injector according to an embodiment of the present disclosure.

FIG. 12 shows a chamber portion 390 of a plasma source including a diffuser 392 and a side downward injector 394. In an embodiment, gas injection below the plasma source may be from the side downward injector 394 that injects gas below the plasma source and/or a showerhead 396 and into a substrate processing chamber. This configuration allows side injection at different angles for purpose of injecting into different areas above a substrate. This configuration also allows independent control of gas injection into the plasma source.

Figure 13:
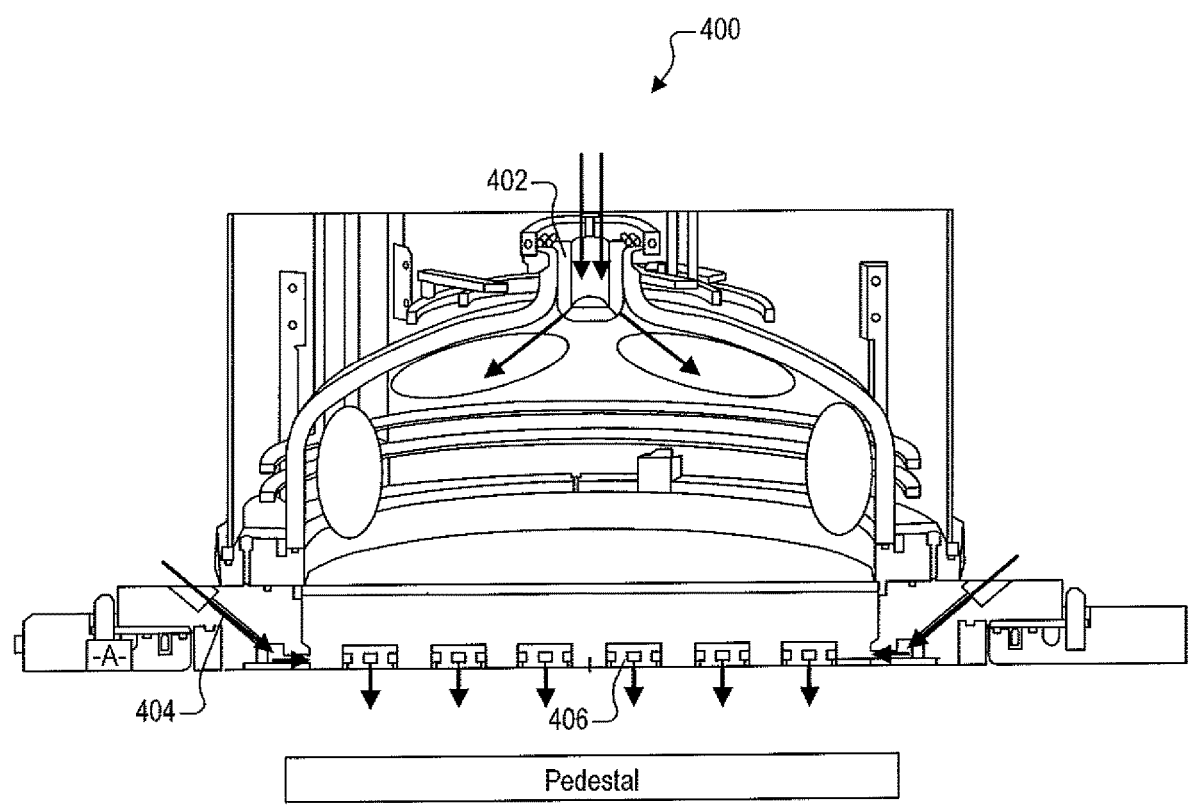
FIG. 13 is a cross-sectional side view of a chamber portion of a plasma source including a diffuser and a side downward injector and distribution plate according to an embodiment of the present disclosure.

FIG. 13 shows a chamber portion 400 of a plasma source including a diffuser 402, a side downward injector 404, and distribution plate (or showerhead) 406. The side downward injector 404 provides gas to the distribution plate 406 rather than injecting gas below the plasma source, below the distribution plate 406 and into the corresponding substrate processing chamber. This configuration also allows independent control of gas injection into the plasma source and the substrate processing chamber.

Figure 14:
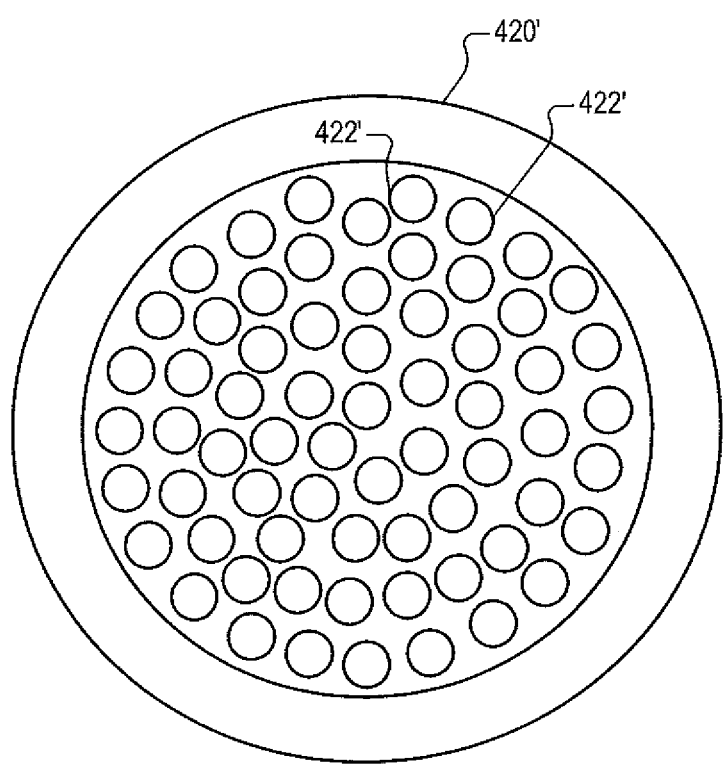
FIG. 14 is a bottom view of a showerhead according to an embodiment of the present disclosure.

FIG. 14 shows a bottom view of a showerhead 420. The showerhead 420 may replace other showerheads disclosed herein and may have a pattern of holes 422. The holes 422 may have diameters of greater than a predetermined diameter. The pattern of holes having the stated diameters minimizes flow resistance of gas and/or plasma between (i) an area in a plasma source and (ii) an area between the showerhead 420 and a substrate.

Figure 15:
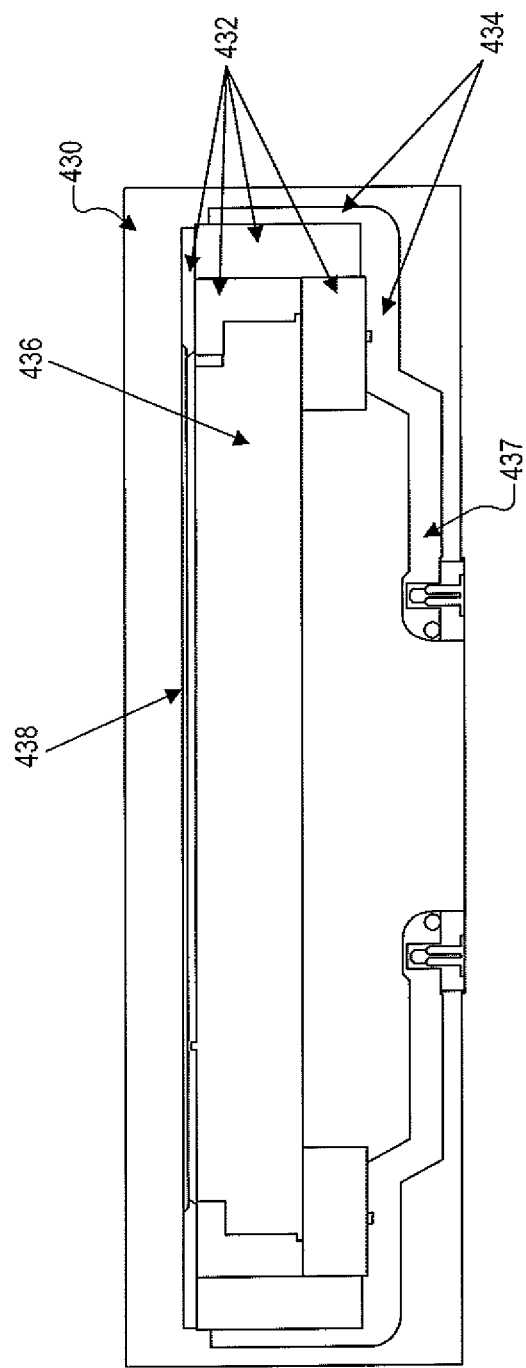
FIG. 15 is a cross-sectional side view of a pedestal incorporating insulators and a ground shield according to an embodiment of the present disclosure.

FIG. 15 shows of a pedestal 430 including insulators 432, a ground shield 434, a RF electrode 436, and a substrate 438. The RF electrode may include an electrostatic chuck. An open area 437 may be at atmospheric pressure and may exist (i) between the insulators 432, and (ii) between the RF electrode 436 and the ground shield 434. The insulators 432 and the RF electrode 436 are disposed in the ground shield 434. As a result, the pedestal sides and bottom of the RF electrode 436 are separated from an interior of the substrate processing chamber by the ground shield 434, which prevents parasitic plasma formation on the sides of or beneath the pedestal 430. The pedestal 430 may replace the substrate support 122 of FIG. 1.

Figure 16:
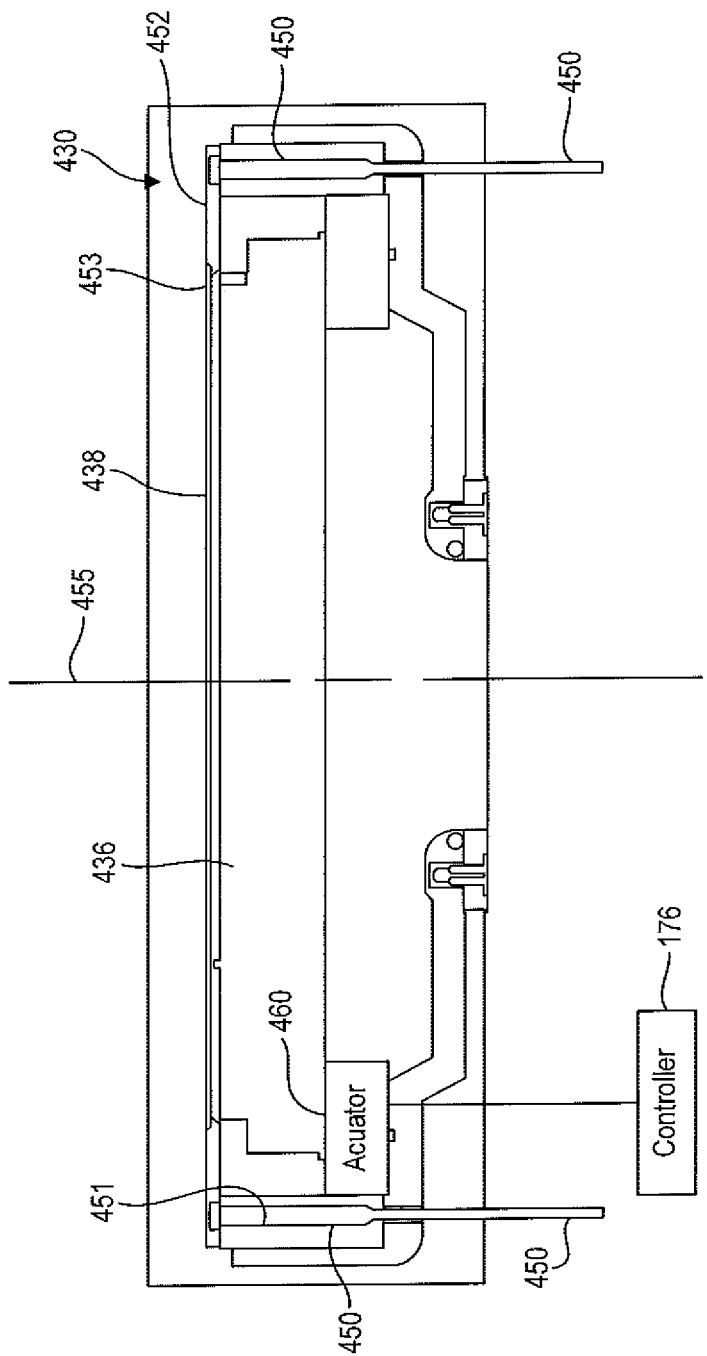
FIG. 16 is a cross-sectional side view of a pedestal incorporating lift pins and a c-ring according to an embodiment of the present disclosure.

FIG. 16 shows the pedestal 430 incorporating lift pins 450 and a c-ring 452. The lift pins 450 are used to raise and lower the c-ring 452 relative to the pedestal 430. The lift pins 450 are located radially outside of the RF electrode 436 and may slide within guides 451, which may be in one or more of the insulators 432. The RF electrode 436, the c-ring 452 and the substrate 438 may be centered on or in the pedestal 430 relative to a centerline 455, which extends vertically through the pedestal.

The c-ring 452 is provided to raise and lower a substrate (e.g., the substrate 438) relative to the pedestal 430. The c-ring 452 may be have a same or greater thickness than the substrate and has a tapered or stepped inner surface 453, which is in contact with the substrate when the substrate is set on the c-ring 452. The inner surface 453 may be shaped to receive and hold the substrate. The outer diameter of the substrate may match an inner diameter of the inner surface 453. The lift pins 450 may be translated in a z-direction (or vertically) or the pedestal 430 may be translated in the z-direction to move the c-ring 452 and thus the substrate relative to the pedestal 430. If the pedestal 430 is moved in the z-direction, bottoms of the lift pins 450 may come in contact with a bottom of the substrate processing chamber and cause the lift pins 450 to move upward relative to the pedestal 430, thereby lifting the substrate 438 off of the pedestal. Movement of the substrate 438 relative to the pedestal 430 and the shape of the c-ring 452 allow the substrate 438 to be placed on and removed from the pedestal 430 via a substrate transfer plate (or paddle). The lift pins 450 are located outside of the RF electrode 436 and are not under the substrate 438. The transfer plate may be laterally inserted in the open end of the c-ring 452.

The lift pins 450 may be translated via one or more pneumatic, electrical, and/or mechanical actuators (a single actuator 460 is shown), which may be located within the pedestal 430 and as an example below the RF electrode 436. The controller 176 may be connected to and control positions of the lift pins 450 relative to the pedestal 430. Each of the actuators and/or corresponding actuator assemblies may include a low voltage solenoid, a low voltage electrical motor, a pneumatic motor, linkages, etc.

Incorporation of the lift pins 450 outside of the RF electrode 436 provides improved thermal uniformity and RF uniformity in the RF electrode 436. This is because the RF electrode 436 does not have holes for the lift pins and gases cannot be ionized within holes of the RF electrode 436 associated with lift pins, as with a traditional pedestal. There is also less risk of arcing in lift pin areas since the lift pins 450 are not in the RF electrode 436 and are insulated from the RF electrode 436 via the insulators 432. This improves system reliability.

Figure 17:
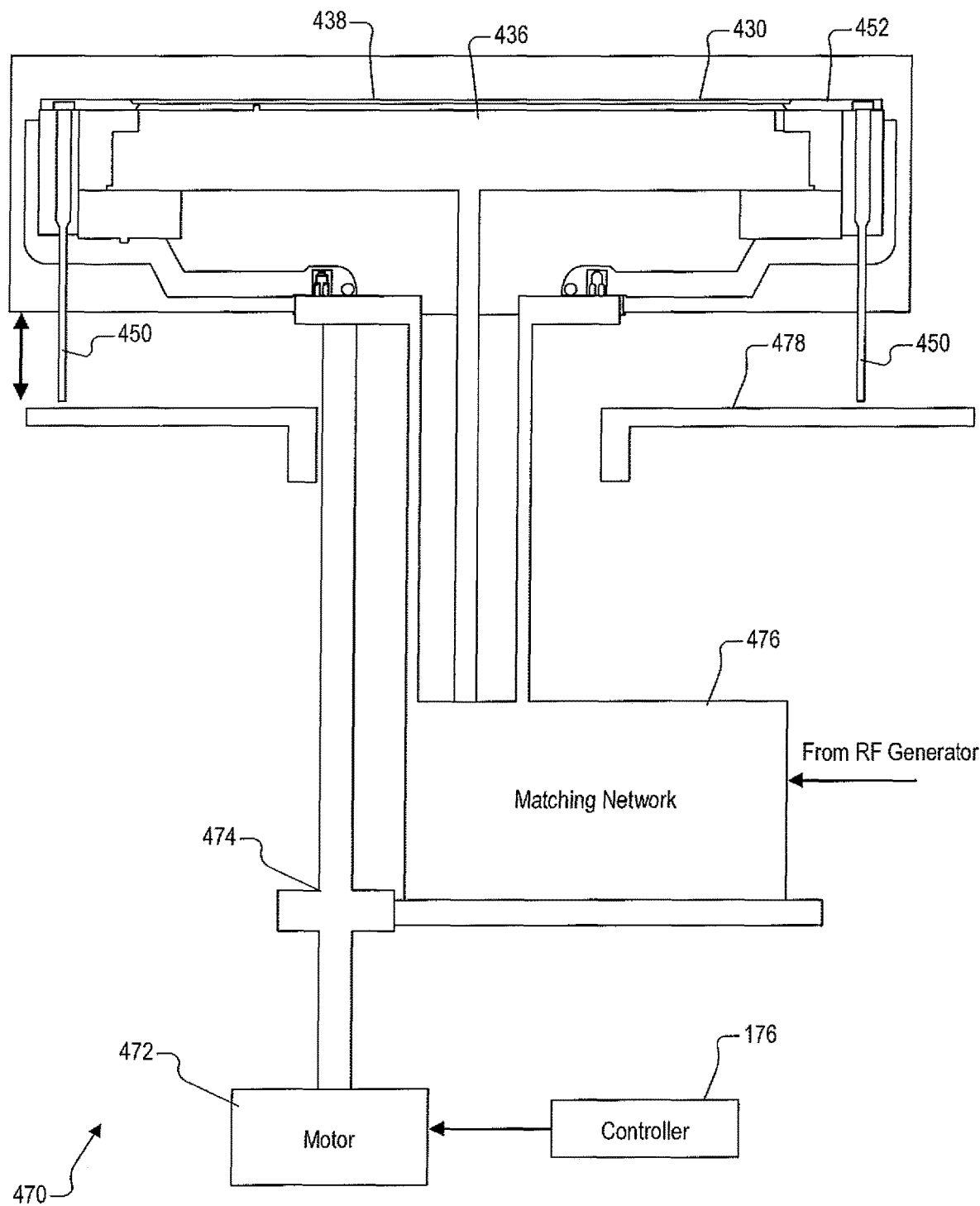
FIG. 17 is a functional block and cross-sectional side view of a pedestal system illustrating z-motion of pedestal and substrate.

FIG. 17 shows a pedestal system 470 that includes the pedestal 430, a motor 472, and a drive screw assembly 474. The substrate support 122 of FIG. 1 may include and/or be implemented as the pedestal 430. The pedestal 430 may be moved in the z-direction via the motor 472 and the drive screw assembly 474. The motor 472 may be controlled by the controller 176. The RF electrode 436 may be connected to a matching network 476, which may receive RF power from the RF generator 172 of FIG. 1. The lift pins 450 may bump against a ledge 478 when the pedestal 430 is moved downward, thereby lifting the c-ring 452 and the substrate 438.

Figure 18:
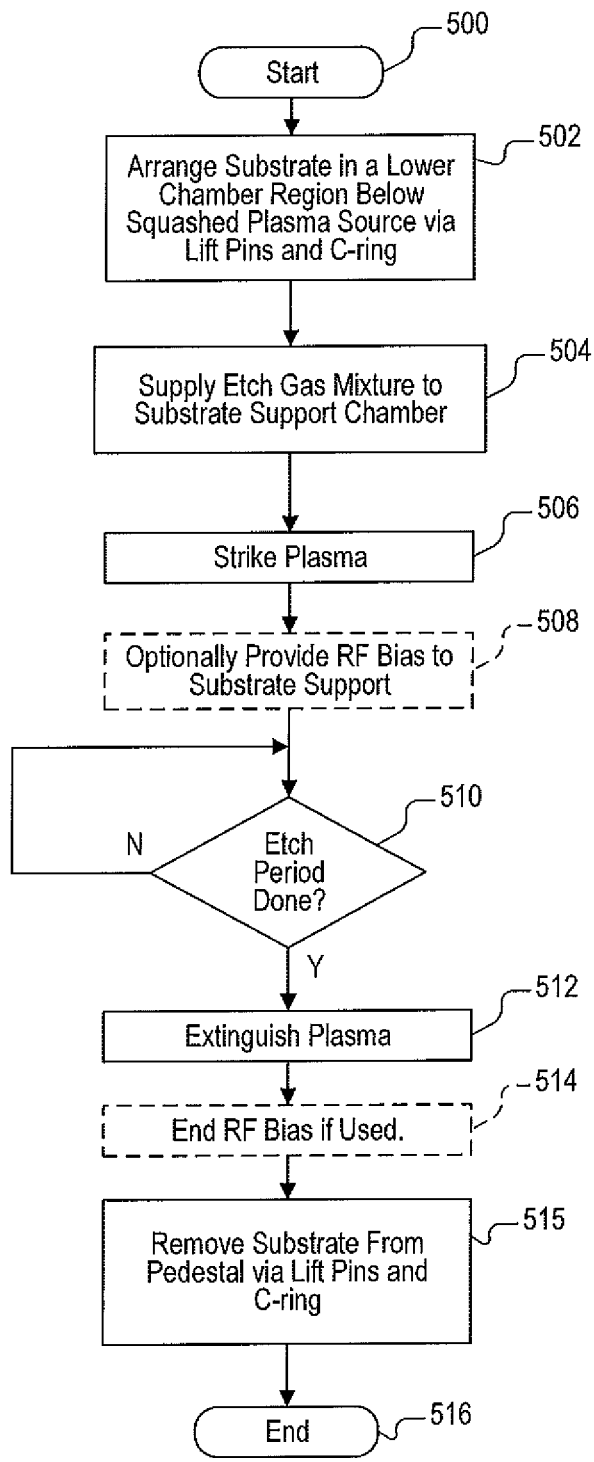
FIG. 18 illustrates a method of operating a substrate processing system according to an embodiment of the present disclosure.

For further defined structure of the controller and/or other devices of the substrate processing system 100 of FIG. 1 see below provided method of FIG. 18 and below provided definition for the term "controller". The substrate processing system 100 may be operated using numerous methods, an example method is illustrated in FIG. 18. In FIG. 18, a method of operating a substrate processing system is shown. Although the following tasks are primarily described with respect to the implementations of FIGS. 1-17, the tasks may be easily modified to apply to other implementations of the present disclosure. The tasks may be iteratively performed.

The method may begin at 500. At 502, a substrate is arranged on a substrate support (e.g., the substrate support 122 or the pedestal 430) in the lower chamber region 102. This may be done by moving the pedestal 430 and/or the c-ring 452 in the z-direction such that the c-ring 452 is moved away from the pedestal 430 and/or RF electrode 436 and allows for the substrate to be set on the c-ring 452. Once the substrate is set on the c-ring 452, the c-ring 452 may be moved towards the pedestal 430 and/or RF electrode 436. The substrate may include multiple layers including one or more film layers. The one or more film layers, such as a semiconductor film layer formed of SiN.

At 504, one or more etch gases and/or one or more etch gas mixtures is provided by the gas delivery system 150-1 and/or 150-2 via the gas injector 142 to the upper chamber region 104. The etch gas mixture may include an etch precursor, such as carbon tetrafluoride ($CF_4$), sulfur hexafluoride ($SF_6$), nitrogen trifluoride ($NF_3$) and/or other etch precursor.

At 506, the plasma is struck in the upper chamber region 104. At 508, an RF bias is optionally supplied to the substrate support via the RF generator 186 and matching network 188. At 510, the controller 176 may determine whether a predetermined etch period has ended. If the etch period has ended, task 512 is performed. At 512, the plasma is extinguished when the predetermined etch period ends. At 514, the RF bias is terminated if used. At 515, the substrate may be removed from the pedestal 430. This may include actuating pedestal and/or the c-ring 452 to move the substrate away from the pedestal 430 and/or RF electrode 436. The substrate may then be removed from the c-ring 452 via a transfer plate (or paddle). The method may end at 516.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A chamber member of a plasma source comprising:
   a sidewall surrounding an upper region of a substrate processing chamber, wherein the sidewall is cylindrically-shaped;
   a transition member connected to the sidewall;
   a top wall connected to the transition member; and
   an injector connecting member connected to the top wall, positioned vertically higher than the sidewall, and configured to connect to a gas injector, wherein gas passes through the injector connecting member via the gas injector and into the upper region of the substrate processing chamber,
   wherein
   an angle between the sidewall and the tog wall is between 100-145°,
   a thickness of at least one of the sidewall, the transition member, the top wall, or the injector connecting member is 0.4-0.6 inches, and
   at least one of
   a center height to low inner diameter ratio of the chamber member is 0.25-0.5, or
   an outer height to center height ratio of the chamber member is 0.4-0.85.

2. The chamber member of claim 1, wherein the top wall is semi-linear shaped.

3. The chamber member of claim 1, wherein the top wall is linear shaped.

4. The chamber member of claim 1, wherein the center height to low inner diameter ratio of the chamber member is 0.35-0.45.

5. The chamber member of claim 1, wherein the outer height to center height ratio of the chamber member is 0.5-0.6.

6. A plasma source comprising:
   the chamber member of claim 1;
   a first coil disposed above a center portion of the chamber member and around the injector connecting member; and
   a second coil disposed around the sidewall.

7. The plasma source of claim 6, wherein the first coil and the second coil are connected in series.

8. The plasma source of claim 6, wherein the first coil and the second coil are connected in parallel.

9. The chamber member of claim 8, further comprising a third coil connected in series with one of the first coil and the second coil.

10. The chamber member of claim 8, further comprising:
    a third coil disposed above the center portion of the chamber member and around the injector connecting member and connected in series with the first coil; and
    a fourth coil disposed around the sidewall and connected in series with the second coil.

11. The plasma source of claim 6, further comprising:
    a generator supplying current to the first coil and the second coil; and a controller configured to control the supply of current to the first coil and the second coil, wherein current supplied to the first coil is controlled independently of current supplied to the second coil.

12. The plasma source of claim 6 further comprising a diffuser configured to spread gases in the upper region of the substrate processing chamber.

13. The plasma source of claim 12, wherein:
the diffuser includes a plurality of channels; and
the plurality of channels receive respective gases.

14. A protective enclosure comprising:
the plasma source of claim 6;
a ground separation shield separating a first enclosed area of the protective enclosure from a second enclosed area of the protective enclosure; and
connector pins disposed partially within the first area and connected to a capacitor and the first coil, wherein the capacitor is disposed in the first area, and
wherein the plasma source is disposed in the second area.

15. A substrate processing chamber comprising:
the chamber member of claim 1; and
a second injector that injects gas upward and into the substrate processing chamber.

16. A substrate processing chamber comprising:
the chamber member of claim 1; and
a second injector that injects gas downward, below a distribution plate or showerhead, and into the substrate processing chamber.

17. A substrate processing chamber comprising:
the chamber member of claim 1;
a distribution plate; and
a second injector that injects gas through the distribution plate and into the substrate processing chamber.

18. A substrate processing system comprising:
the chamber member of claim 1;
a plasma source comprising the chamber member;
a plurality of radio frequency components including a capacitance;
a ground shield; and
a protective enclosure,
wherein
the plasma source, the plurality of radio frequency components and the ground shield are disposed within the protective enclosure, and
the ground shield separates the plurality of radio frequency components from the plasma source.

19. The substrate processing system of claim 18, wherein the protective enclosure comprises:
a top wall;
insulators connected to the top wall of the protective enclosure;
pins that pass through the insulators; and
a controller that connects to the pins and supplies current to the plurality of radio frequency components.

20. The substrate processing system of claim 18, further comprising a pedestal, wherein the pedestal comprises:
a radio frequency electrode;
a plurality of lift pins that are located radially outside the radio frequency electrode; and
a c-ring that receives a substrate, wherein the plurality of lift pins move the c-ring relative to the pedestal.

21. The chamber member of claim 1, wherein the thickness of the at least one of the sidewall, the transition member, the top wall, or the injector connecting member is 0.5 inches.

22. The chamber member of claim 1, wherein the thickness of each of the sidewall, the transition member, the top wall, and the injector connecting member is 0.4-0.6 inches.

23. A plasma source comprising:
a chamber member comprising
a sidewall surrounding an upper region of a substrate processing chamber, wherein the sidewall is cylindrically-shaped,
a transition member connected to the sidewall,
a top wall connected to the transition member, and
an injector connecting member connected to the top wall, positioned vertically higher than the sidewall, and configured to connect to a gas injector, wherein gas passes through the injector connecting member via the gas injector and into the upper region of the substrate processing chamber,
wherein
an angle between the sidewall and the top wall is between 100-145°, and
at least one of
a center height to low inner diameter ratio of the chamber member is 0.25-0.5, or
an outer height to center height ratio of the chamber member is 0.4-0.85;
a first coil disposed above a center portion of the chamber member and around the injector connecting member;
a second coil disposed around the sidewall; and
a third coil connected in series with one of the first coil and the second coil and disposed around one of the injector connecting member or the sidewall.

24. The plasma source of claim 23, wherein the third coil is connected in series with the first coil and disposed above the center portion and around the injector connecting member.

25. The plasma source of claim 23, wherein the third coil is connected in series with the second coil and disposed around the sidewall.

26. The plasma source of claim 23, further comprising a fourth coil connected in series with the second coil and disposed around the sidewall,
wherein the third coil is connected in series with the first coil and disposed above the center portion and around the injector connecting member.

27. A protective enclosure comprising:
the plasma source of claim 23;
a ground separation shield separating a first enclosed area of the protective enclosure from a second enclosed area of the protective enclosure; and
connector pins disposed partially within the first area and connected to a capacitor and the first coil, wherein the capacitor is disposed in the first area, and
wherein the plasma source is disposed in the second area.

* * * * *